United States Patent [19]

Olah

[11] 3,724,280

[45] Apr. 3, 1973

[54] MANUAL TUNING APPARATUS FOR RADIO RECEIVER

[75] Inventor: Emery E. Olah, Des Plaines, Ill.

[73] Assignee: Motorola, Inc., Franklin Park, Ill.

[22] Filed: May 14, 1971

[21] Appl. No.: 143,506

[52] U.S. Cl.....................................74/10.33, 74/10.39

[51] Int. Cl................................................F16h 35/18

[58] Field of Search....74/10.39, 10.8, 10, 422, 10.33

[56] References Cited

UNITED STATES PATENTS

| | | | |
|---|---|---|---|
| 2,275,698 | 3/1942 | Strauss et al. | 74/78 |
| 2,388,175 | 10/1945 | Oakley | 74/78 |
| 2,489,595 | 11/1949 | Spoor | 74/422 X |
| 2,808,506 | 10/1957 | Skwarck | 74/10.39 X |

*Primary Examiner*—Milton Kaufman
*Attorney*—Vincent J. Rauner and R. J. La Porte

[57] ABSTRACT

Manual tuning apparatus for a pushbutton type radio receiver includes a capstan drive shaft mounted for rotation in response to the manual rotation of the radio tuning knob. A leaf spring coupled to the core carriage of the slug tuned coil assembly of the radio receiver is held in frictional engagement with the drive shaft and moved along a path adjacent the shaft in response to the rotation of the tuning knob, to in turn adjust the setting of the tuning coil assembly. Upon depression of a pushbutton to select a preset radio frequency, the leaf spring is releasable from engagement with the drive shaft to disable momentarily, the manual tuning apparatus.

4 Claims, 3 Drawing Figures

INVENTOR:
EMERY E. OLAH
BY: Ronald J. LaPorte
ATTY.

MANUAL TUNING APPARATUS FOR RADIO RECEIVER

BACKGROUND

This invention relates generally to pushbutton type radio receivers and more particularly to such radio receivers which also include manually operated wave signal tuning apparatus.

SUMMARY

An object of the present invention is to provide, in a radio receiver, new and improved manual wave signal tuning apparatus.

It is another object of the invention to provide tuning apparatus of the above-described type for use in radio receiver units also having pushbuttons for adjusting the wave signal tuning of the receiver.

Briefly, a preferred embodiment of the manual tuning apparatus according to the invention includes a tuning knob extending outwardly at the front of the radio receiver in which the apparatus is used, coupled to a gear mounted for rotation on a vertically extending capstan drive shaft. A leaf spring connected to a movable carriage upon which the tuning cores of the radio receiver are mounted, is sandwiched between the drive shaft and a spring loaded roller. The force provided by the roller is sufficient to move the leaf spring into frictional engagement with the drive shaft, so that the spring is moved by the rotating drive shaft along a path extending transverse the axis of the shaft and between the shaft and roller upon rotation of the tuner knob. In response thereto, the tuning cores mounted on the carriage are moved with respect to corresponding stationary tuning coils provided in the radio receiver.

Upon depressing a pushbutton in the radio receiver, the spring tensioned roller is moved away from the leaf spring, automatically, to disengage the latter from the drive shaft, thereby to disable the manual tuning knob until the pushbutton is released.

DETAILED DESCRIPTION

Figure 1:
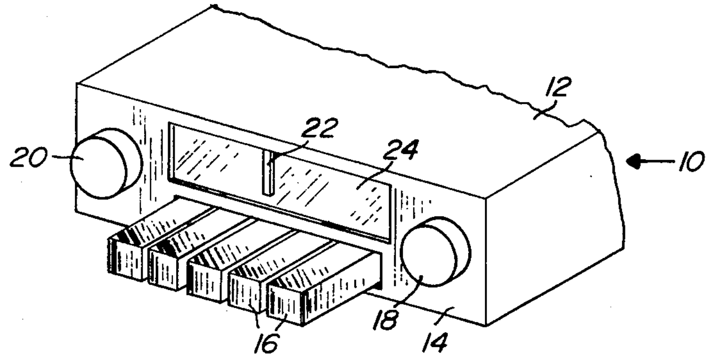
FIG. 1 is an isometric view of a radio receiver in which manual tuning apparatus according to the invention is incorporated.

Referring now to the drawing wherein like numerals have been employed throughout the various views to designate similar parts, there is illustrated in FIG. 1 a radio receiver 10 including a housing 12 having a front wall 14.

A plurality of pushbuttons, each designated by the numeral 16, extend from the receiver through an aperture in front wall 14, and a manual tuning knob 18 and volume/on-off knob 20, extend outwardly through front wall 14 on opposite sides of the pushbuttons.

A pointer 22 is movable across a marked indicator plate 24 located above the pushbuttons. Depression of a pushbutton or the rotation of the manual tuning knob 18 to select a particular wave signal received by the radio receiver moves the pointer to a corresponding setting on the plate.

Figure 2:
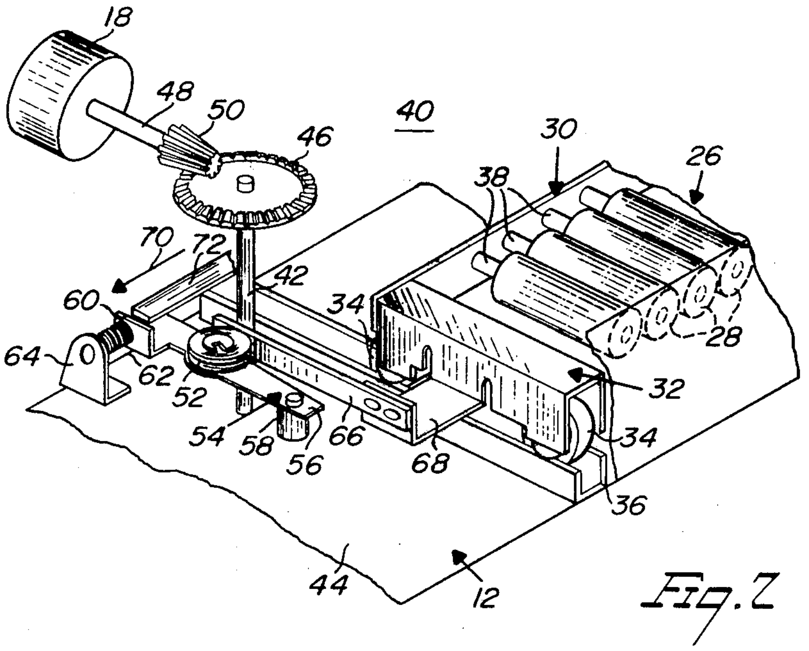
FIG. 2 is a perspective view of the manual tuning apparatus according to the invention, as it appears in a radio receiver unit of the type shown in FIG. 1.
Figure 3:
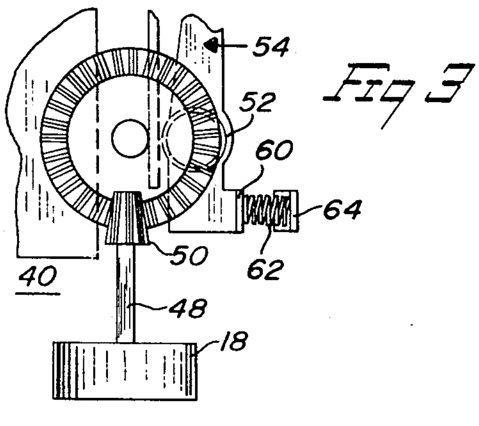
FIG. 3 is a top plan view of the manual tuning apparatus of FIG. 2.

Looking at FIG. 2 of the drawing, there is shown therein a slug tuned coil assembly 26 of the type used conventionally in a radio receiver, such as 10, to adjust the wave signal reception thereof. The coil assembly 26 includes a plurality of stationary coils, each designated by the numeral 28. A carriage 30 is mounted for movement on a pair of spaced brackets 32, only one of which is shown. The brackets each include a pair of wheels 34 mounted thereon for rolling engagement with a set of tracks 36, provided in the housing 12 of the radio receiver.

Connected to carriage 30, is a plurality of tuning cores or slugs 38, each of which is positioned for movement with respect to a corresponding coil 28. Movement of the carriage along a path defined by tracks 36, changes simultaneously the positions of cores 38 with respect to coils 28, thereby to alter the wave signal reception of the radio receiver.

Mounted adjacent coil assembly 26 is a preferred embodiment of manual tuning apparatus 40 according to the invention. The manual tuning apparatus includes a vertically extending capstan drive shaft 42 mounted for rotation on the lower wall 44 of housing 12. A gear member 46 is fixedly mounted to the shaft for rotation therewith.

A horizontally extending shaft 48 is attached to the tuning knob 18 of the radio receiver, and a conical gear 50 connected at the free end thereof meshes with gear 46. Thus, upon rotating knob 18, capstan drive shaft 42 is rotated as well.

An idler roller 52 is mounted for rotation on a horizontally extending arm 54 which is pivotally mounted at a first end 56 on a mounting post 58 extending from the base wall 44 of the housing. The opposite end 60 of arm 54 is bent upwardly for engagement with a coil spring 62 extending outwardly from a bracket 64 mounted on base wall 44. The spring 62 provides a force directed against arm 54, pivoting the arm clockwise as seen in FIG. 2, thereby to move roller 52 toward the capstan drive shaft.

A leaf spring 66 attached to an extension 68 of bracket 32, extends along a path transverse the axial direction of capstan drive shaft 42; in this case, horizontally outwardly therefrom, between the drive shaft 42 and roller 52. The force provided by spring 62 is sufficient to move roller 52 against leaf spring 66, thereby to press the last-mentioned spring into frictional engagement with the capstan drive shaft. Thus, upon rotation of capstan shaft 42, leaf spring 66 is moved along a path extending between the roller and capstan shaft, to in turn vary the position of cores 38 connected to carriage 30, with respect to corresponding coils 28. The change of position of the cores, as described, changes the wave signal reception of the radio receiver 10.

To disengage the manual tuning apparatus 40 while making use of a pushbutton 16 to select a preset radio frequency, a force must be applied in a direction of arrow 70 against the force of spring 62, thereby to reduce or eliminate the force provided through roller 52 against leaf spring 66. In FIG. 2 of the drawing, it is shown that the release force required may be provided by a clutch bar 72 which is movable in the direction of arrow 70 against the end 60 of arm 54. The clutch bar is moved in the direction of arrow 70 in response to the depression of any one of the pushbuttons 16. The mechanics of coupling the clutch bar 72 to the pushbutton 16 is not shown in the drawing, but will be obvious to one skilled in the art.

To provide a maximum of friction between the leaf spring 66 and capstan drive shaft 42 to drive the former along a path between the shaft and roller 52, the outer surface of the capstan shaft can be formed of a material having a high coefficient of friction or may be coated with a rubber or the like material. Likewise, roller 52 can be of a resilient material, such as rubber or the like.

It should be understood that while manual tuning apparatus 40 has been illustrated in conjunction with a particular type of tuned coil assembly and movable core carriage arrangement, it is not limited to use therewith.

Manual tuning apparatus according to the invention may also be used with other varieties of carriage arrangements employed in radio receivers, such as, for example, the treadle bar type.

I claim:

1. Manual tuning apparatus for use in a pushbutton type radio receiver for controlling the position of movable tuning elements, said manual tuning apparatus including in combination: rotatable drive shaft means, manually operable selector means coupled to said drive shaft means for rotation thereof in response to the operation of said selector means, a member connectible with said tuning elements, said member extending transverse the axial direction of said drive shaft means and mounted for frictional engagement therewith, whereby upon rotation of said shaft means, said member is moved along a path adjacent said shaft means, thereby to change the position of said tuning elements in accordance therewith, resiliently biased means mounted for engagement with said member and providing sufficient force thereagainst to maintain said member in frictional engagement with said rotatable drive shaft means and declutch means including a member mounted for movement into engagement with said resiliently biased means during the operation of a pushbutton to substantially remove said force against said transversely extending member.

2. Manual tuning apparatus as claimed in claim 1 wherein said resiliently biased means include a freely rotatable roller mounted for rolling engagement with said member and spring means urging said roller into engagement with said member.

3. Manual tuning apparatus for use in a pushbutton type radio receiver for controlling the position of movable wave signal tuning elements, said manual tuning apparatus including in combination; a manual tuning knob mounted for rotation on a first shaft, said shaft including first gear means, a second rotatable shaft having second gear means mounted thereon in meshing engagement with said first gear means, an elongated member having substantially flat side surfaces connectible with said tuning elements, said member extending transverse the axial direction of said second rotatable shaft with a first flat surface thereof engaging said last-mentioned shaft, roller means mounted for rotation adjacent the opposite flat surface of said member and resilient biasing means urging said roller means into engagement with said member and providing a force thereagainst sufficient to maintain said member in frictional engagement with said second rotatable shaft, whereby upon rotation of said tuning knob, said member is driven by said second rotatable shaft along a path, thereby to change the positioning of said tuning elements, and declutch means including a member mounted for movement into engagement with said resilient biasing means to release the latter during the operation of a pushbutton in said radio to substantially remove said force against said elongated member.

4. Manual tuning apparatus as claimed in claim 3 wherein said roller means include a roller mounted for rotation on a pivotal arm and wherein said resilient biasing means include a spring coupled to said arm, providing a force thereagainst to rotate said arm about its pivot point, thereby to move said roller into engagement with said elongated arm.

* * * * *